United States Patent
Noh et al.

(10) Patent No.: US 8,207,781 B2
(45) Date of Patent: Jun. 26, 2012

(54) SPDT SWITCH FOR RADIO FREQUENCY SWITCHING AND METHOD FOR ENHANCING ISOLATION THEREOF

(75) Inventors: Youn Sub Noh, Daejeon (KR); In Bok Yom, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 91 days.

(21) Appl. No.: 12/822,718

(22) Filed: Jun. 24, 2010

(65) Prior Publication Data

US 2011/0140763 A1    Jun. 16, 2011

(30) Foreign Application Priority Data

Dec. 16, 2009  (KR) .................. 10-2009-0125606

(51) Int. Cl.
*H03K 17/72* (2006.01)
(52) U.S. Cl. ......... 327/436; 327/478; 327/508; 333/103
(58) Field of Classification Search ............ 327/436, 327/478, 503, 508; 333/101–103
See application file for complete search history.

(56) References Cited

U.S. PATENT DOCUMENTS

| | | | |
|---|---|---|---|
| 5,642,083 A * | 6/1997 | Kato et al. | 333/103 |
| 6,265,953 B1 * | 7/2001 | Romano | 333/101 |
| 6,288,620 B1 * | 9/2001 | Atokawa et al. | 333/103 |
| 7,092,677 B1 | 8/2006 | Zhang et al. | |
| 7,538,643 B2 * | 5/2009 | Mizutani | 333/262 |

FOREIGN PATENT DOCUMENTS

| | | |
|---|---|---|
| KR | 2004-0091182 A | 10/2004 |
| KR | 2006-0094005 A | 8/2006 |
| WO | WO-2004/086623 A1 | 10/2004 |

* cited by examiner

*Primary Examiner* — Kenneth B. Wells
(74) *Attorney, Agent, or Firm* — Rabin & Berdo, P.C.

(57) ABSTRACT

Provided is an SPDT switch having improved isolation characteristics in an RF band. The SPDT switch includes a serial switching unit, a current sink unit, a switching isolation unit, and a DC blocking unit. The serial switching unit includes first and second HBTs. The current sink unit sinks a current flowing from a common input terminal to each of first and second output terminals of the serial switching unit. The switching isolation unit causes an unselected output terminal of the first and second output terminals to be electrically isolated from the common input terminal when the serial switching unit operates. The DC blocking unit blocks a DC between the first HBT and the first output terminal and a DC between the second HBT and the second output terminal. Accordingly, it is possible to provide better insertion-loss and isolation characteristics in higher frequency bands than typical switches.

19 Claims, 3 Drawing Sheets

SPDT SWITCH FOR RADIO FREQUENCY SWITCHING AND METHOD FOR ENHANCING ISOLATION THEREOF

CROSS-REFERENCE TO RELATED APPLICATIONS

This U.S. non-provisional patent application claims priority under 35 U.S.C. §119 of Korean Patent Application No. 10-2009-0125606, filed on Dec. 16, 2009, the entire contents of which are hereby incorporated by reference.

BACKGROUND OF THE INVENTION

The present invention disclosed herein relates to a switch used to control the path of a Radio Frequency (RF) signal in a Microwave Frequency (MF) component and system, and more particularly, to a Single Pole Double Throw (SPDT) switch operating in the RF band such as the MF band.

Due to the development of the wireless communication industry, RF components such as switches, high-output amplifiers, oscillators and low-noise amplifiers, which are fabricated using Integrated Circuit (IC) technology, are being developed in various application fields such as mobile phones and wireless Local Area Networks (LANs). With the development of the wireless communication industry, available frequency bands are increasing and RF components, capable of operating at frequencies higher than the X band, are being required.

Typical SPDT switches are implemented using Field Effect Transistor (FET)-based elements. In designing SPDT switches, large-area FET elements are used as serial switching elements to reduce the insertion loss and small-area FET elements are used as parallel switching elements, connected in parallel to serial switching elements, to improve the isolation characteristics.

Research for improvement of the SPDT switch performance is being conducted variously according to application fields. For example, a circuit structure for an SPDT switch using a parallel resonator is disclosed in Korean Patent Publication No 10-2004-91182. The Korean Patent Publication No 10-2004-91182 discloses a technology for eliminating parasitic components to increase the isolation and decrease the insertion loss.

Also, a structure of adding an impedance conversion circuit between switching elements is disclosed in Korean Patent Publication No. 10-2006-94005. The Korean Patent Publication No. 10-2006-94005 discloses a circuit technology for securely shorting/opening the on/off impedance of a switching to provide a high isolation and a low insertion loss. However, the switch of the Korean Patent Publication No. 10-2006-94005 has narrow-band characteristics because it basically includes a filter structure. Thus, the switch of the Korean Patent Publication No. 10-2006-94005 is limited in terms of application field and is difficult to use in wider bands.

FIG. 1 is a circuit diagram of a typical Complementary Metal Oxide Semiconductor (CMOS) SPDT switch.

Referring to FIG. 1, the typical CMOS SPDT switch includes a serial switching unit and a switching isolation unit. The serial switching unit includes a first CMOS switch 104 and a second CMOS switch 105. The switching isolation unit includes a first N-type MOS (NMOS) transistor 106 and a second NMOS transistor 107. When the serial switching unit operates, the switching isolation unit causes one (i.e., an unselected output terminal) of first and second output terminals P2 and P3 to be electrically isolated from a common input terminal P1.

The first CMOS switch 104 is connected between the first output terminal P2 and the common input terminal P1, and the second CMOS switch 105 is connected between the second output terminal P3 and the common input terminal P1. According to the levels of voltages applied respectively to first and second control terminals VC1 and VC2, a switching path is formed between the common input terminal P1 and the first output terminal P2 or between the common input terminal P1 and the second output terminal P3. For example, when a switch-on voltage is applied to the first control terminal VC1 and a switch-off voltage is applied to the second control terminal VC2, the first CMOS switch 104 is turned on and the second CMOS switch 105 is turned off. In this case, the first NMOS transistor 106 connected to the first output terminal P2 is turned off, and the second NMOS transistor 107 connected to the second output terminal P3 is turned on. Accordingly, an RF signal applied to the common input terminal P1 is outputted through the first CMOS switch 104 to the first output terminal P2. Herein, the first/second NMOS transistor 106/107 connected in parallel to the first/second output terminal P2/P3 serves as a shunt element used to increase the isolation of the switch circuit.

Since the typical CMOS SPDT switch uses the CMOS switches as switching elements, it provides easy switching control and has little power consumption. However, as the signal operating frequency increases, the insertion loss increases and the isolation characteristic of the typical CMOS SPDT switch decreases, particularly by the parasitic capacitance.

FIG. 2 is a simplified circuit diagram and an equivalent circuit diagram of the CMOS switch of FIG. 1, which illustrates a simplified circuit and an equivalent circuit of a CMOS element used as a switching element in an RF/MF band.

Referring to FIG. 2, a MOS transistor 204 switches between a first terminal 202 and a second terminal 203 according to the level of a voltage applied to a control terminal 201, which corresponds to one of the CMOS switches 104 and 105 of FIG. 1. As illustrated in the equivalent circuit diagram, an on/off operation of the MOS transistor 204 may be represented by the size change of a variable resistor VR1. Also, since the CMOS switching element always has a capacitance component, it includes an equivalent capacitor C1 and a junction capacitance at a diode D2. As the operating frequency increases, such a parasitic capacitance component increasingly affects the switching operation, thus decreasing the switching isolation in the RF/MF band.

What is therefore required is a technology for fabricating a switch that has a smaller and simpler structure, provides a lower insertion loss and a higher isolation and has good characteristics even in a wide frequency range.

SUMMARY OF THE INVENTION

Embodiments of the present invention provide an RF SPDT switch and a method for enhancing a switching isolation thereof, which can reduce the insertion loss and increase the switching isolation.

Embodiments of the present invention also provide an SPDT switch that can reduce the insertion loss and the return loss and improve the frequency characteristics.

Embodiments of the present invention also provide an SPDT switch that can be fabricated in a small size by simplifying a bias circuit of an HBT element.

Embodiments of the present invention also provide an RF SPDT switch that has a simple circuit structure and has good operation characteristics in the MF band or higher frequency bands.

Embodiments of the present invention also provide an RF SPDT switch that can block or minimize a leakage current in a switching operation.

In some embodiments of the present invention, SPDT switches include: a serial switching unit including first and second HBTs connected in series to a common input terminal; a current sink unit sinking a current, flowing from the common input terminal to each of first and second output terminals of the serial switching unit, in response to a control signal; a switching isolation unit causing an unselected output terminal of the first and second output terminals to be electrically isolated from the common input terminal when the serial switching unit operates; and a DC blocking unit blocking a DC component between the first HBT and the first output terminal and a DC component between the second HBT and the second output terminal.

In some embodiments, the current sink unit includes: a first NMOS transistor sinking a current, flowing from the common input terminal to the first output terminal of the serial switching unit, in response to the control signal; and a second NMOS transistor sinking a current, flowing from the common input terminal to the second output terminal of the serial switching unit, in response to a complementary control signal complementary to the control signal.

In other embodiments, the switching isolation unit includes: a first shunt element connected to the first output terminal in parallel to the first HBT; and a second shunt element connected to the second output terminal in parallel to the second HBT. The first and second shunt elements may each include an NMOS transistor. The current blocking unit may include a capacitor.

In other embodiments of the present invention, SPDT switches include: a serial switching unit including first and second HBTs having bases connected in common to a common input terminal; a current sink unit including a first sink element sinking a current, flowing from the common input terminal to a first output terminal of the serial switching unit, in response to a first control signal and a second sink element sinking a current, flowing from the common input terminal to a second output terminal of the serial switching unit, in response to a second control signal; a switching isolation unit causing an unselected output terminal of the first and second output terminals to be electrically isolated from the common input terminal when the serial switching unit operates; and a DC blocking unit blocking a DC component between the emitter of the first HBT and the first output terminal and a DC component between the emitter of the second HBT and the second output terminal.

In some embodiments, the SPDT switch is configured to switch a MR band signal. The first and second sink elements may each include an NMOS transistor. The switching isolation unit may include: a first shunt element connected to the first output terminal in parallel to the first HBT; and a second shunt element connected to the second output terminal in parallel to the second HBT. The first and second shunt elements may each include an NMOS transistor. The direct current blocking unit may include a capacitor.

In further embodiments of the present invention, SPDT switches include: a serial switching unit including a first HBT having a channel connected between a common input terminal and a first output terminal and switching the common input terminal to the first output terminal when a first control signal is applied thereto, and a second HBT having a channel connected between the common input terminal and a second output terminal and switching the common input terminal to the second output terminal when a second control signal is applied thereto; a current sink unit including a first MOS transistor having a gate terminal connected to receive the first control signal and a source terminal grounded to sink a current flowing from the common input terminal to the first output terminal of the serial switching unit, and a second MOS transistor having a gate terminal connected to receive the second control signal and a source terminal grounded to sink a current flowing from the common input terminal to the second output terminal of the serial switching unit; a switching isolation unit including a first shunt element having a gate terminal connected to receive the second control signal and a drain-source channel connected between the first output terminal and a ground terminal to cause the first output terminal to be electrically isolated from the common input terminal when the second output terminal is selected, and a second shunt element having a gate terminal connected to receive the first control signal and a drain-source channel connected between the second output terminal and the ground terminal to cause the second output terminal to be electrically isolated from the common input terminal when the first output terminal is selected; and a DC blocking unit including a first capacitor connected between the emitter of the first HBT and the first output terminal and a second capacitor connected between the emitter of the second HBT and the second output terminal, to block a DC Component.

In some embodiments, the first and second MOS transistors each include an NMOS Field Effect Transistor (FET). The first and second shunt elements may each include an NMOS FET.

In other embodiments, the SPDT switches further include a blocking capacitor between the common input terminal and the bases of the first and second HBTs. The SPDT switches may further include an inductor between a power supply voltage terminal and the bases of the first and second HBTs.

In further embodiments, the second control signal is applied at a low level when the first control signal is applied at a high level. The SPDT switches may be fabricated through a SiGe BiCMOS process.

In still further embodiments of the present invention, methods for enhancing a switching isolation in an SPDT switch, which includes a serial switching unit having first and second switches and a switching isolation unit causing an unselected output terminal of two output terminals to be electrically isolated from a common input terminal when the serial switching unit operates, include: operating one of the first and second switches in response to a control signal; and operating the first and second switches of the serial switching unit to have the operation characteristics of an HBT.

In some embodiments, the switching isolation unit is operated to have the operation characteristics of an NMOS transistor.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
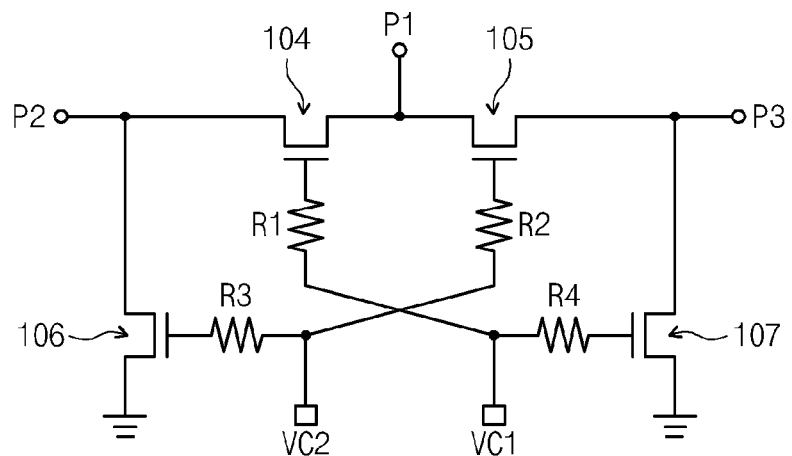
FIG. 1 is a circuit diagram of a typical CMOS-type SPDT switch.
Figure 2:
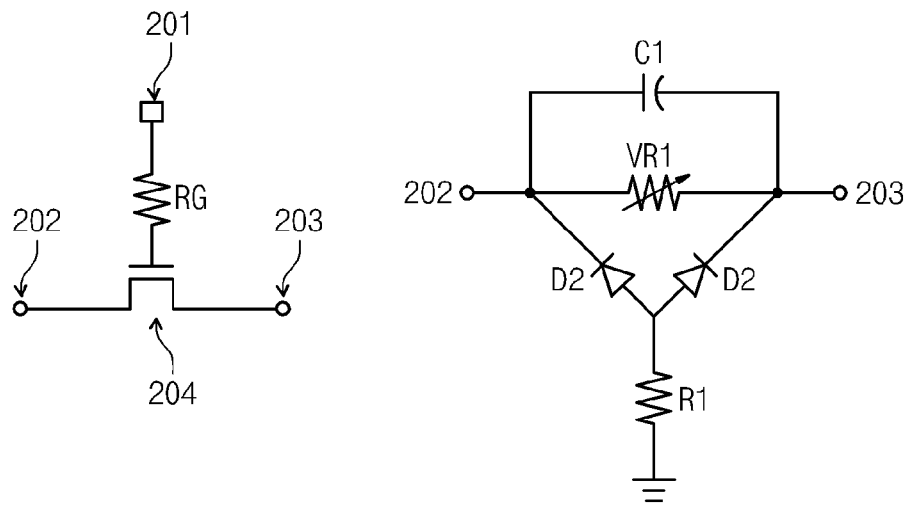
FIG. 2 is a simplified circuit diagram and an equivalent circuit diagram of a CMOS switch of FIG. 1.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that when an element or line is referred to as being connected to a target element, it may be connected directly to the target element or may be connected indirectly to the target element through another element.

It will also be understood that like reference numerals refer to like elements throughout.

It will also be understood that an embodiment described and exemplified herein includes a complementary embodiment thereof.

In embodiments of the present invention, a Bipolar Junction Transistor (BJT)-based Hetero-junction Bipolar Transistor (HBT) and an FET-based MOS transistor are used in a mixed manner to implement an RF SPDT switch. Accordingly, the insertion-loss and isolation characteristics are good even in the higher frequency bands.

In a process (e.g., a SiGe BiCMOS process) capable of fabricating both HBTs and MOS transistors, the simplest way to design an SPDT switch may be to use MOS transistors in both serial elements and parallel elements. However, due to the parasitic component of the MOS transistor, the operating frequency is low and the insertion loss is large. Since the cutoff frequency of the HBT element is about 120 GHz for a 0.25 nm process and about 200 GHz for a 0.13 nm process, the HBT element has an about 3 to 4 times higher cutoff frequency than the MOS transistor. Thus, using the HBT element to design the SPDT switch makes it possible to increase the operating frequency and improve the insertion-loss and return-loss characteristics.

If the SPDT switch is designed using the HBT element, the circuit structure may be complicated because a bias current need be supplied to the HBT element. Therefore, what is also required is a circuit technology for fabricating the smaller SPDT switch.

Hereinafter, an SPDT switch according to an exemplary embodiment of the present invention will be described in detail with reference to FIGS. 3 and 4.

Figure 3:
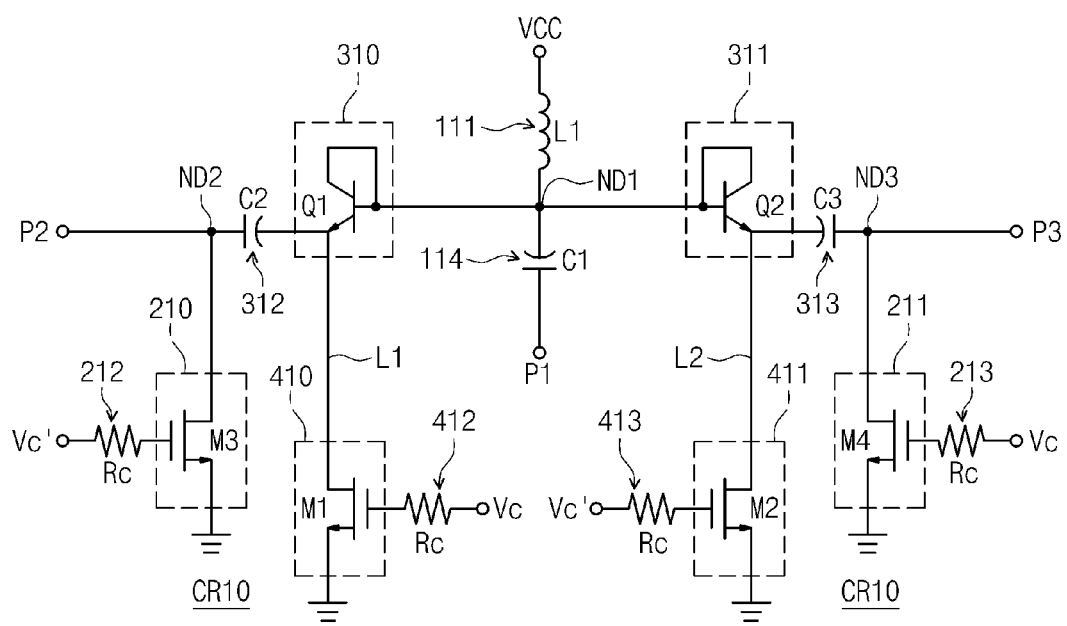
FIG. 3 is a circuit diagram of an SPDT switch according to an exemplary embodiment of the present invention.

FIG. 3 is a circuit diagram of an SPDT switch according to an exemplary embodiment of the present invention. FIG. 4 is a simulation graph illustrating the characteristics of the SPDT switch of FIG. 3.

Referring to FIG. 3, an SPDT switch circuit according to an exemplary embodiment of the present invention includes BJT-based HBT switching elements and FET-based shunt elements. The SPDT switch includes a serial switching unit, a current sink unit, a switching isolation unit, and a Direct Current (DC) blocking unit.

The SPDT switch circuit of FIG. 3 is fabricated through a process (e.g., a SiGe BiCMOS process) capable of providing both FET-based transistors and BJP-based transistors. In the SPDT switch, an HBT element is used as a switching element and a bias circuit of the HBT element is implemented more simply. Accordingly, the switching performance is achieved that operates even in the higher frequency bands.

The serial switching unit includes a first HBT 310 and a second HBT 311. The first HBT 310 has a base and a collector connected in common to a node ND1, and has a channel connected between a common input terminal P1 and a first output terminal P2. When a first control signal Vc is applied thereto, the first HBT 310 switches an RF signal, applied to the common input terminal P2, to the first output terminal P2. The second HBT 311 has a base and a collector connected in common to the node ND1, and has a channel connected between the common input terminal P1 and a second output terminal P3. When a second control signal Vc' is applied thereto, the second HBT 311 switches an RF signal, applied to the common input terminal P2, to the second output terminal P3.

The current sink unit includes a first MOS transistor M1 and a second MOS transistor M2. The first MOS transistor M1 serves as a first sink element 410. The first MOS transistor M1 has a gate terminal connected to receive the first control signal Vc, a source terminal grounded to sink a current flowing from the common input terminal P1 to the first output terminal P2 of the serial switching unit, and a drain terminal connected to the emitter of the first HBT 310. The second MOS transistor M2 serves as a second sink element 411. The second MOS transistor M2 has a gate terminal connected to receive the second control signal Vc', a source terminal grounded to sink a current flowing from the common input terminal P1 to the second output terminal P3 of the serial switching unit, and a drain terminal connected to the emitter of the second HBT 311.

The switching isolation unit includes a first shunt element 210 and a second shunt element 211 to increase the switching isolation in the SPDT switch circuit. The first shunt element 210 includes an NMOS transistor M3, and a second shunt element 211 includes an NMOS transistor M4. The first shunt element 210 has a gate terminal connected to receive the second control signal Vc', and a drain-source channel connected between the first output terminal P2 and a ground terminal. Thus, when the second output terminal P3 is selected as a switching output terminal, the first shunt element 210 causes the first output terminal P2 to be electrically isolated from the common input terminal P1. The second shunt element 211 has a gate terminal connected to receive the first control signal Vc, and a drain-source channel connected between the second output terminal P3 and the ground terminal. Thus, when the first output terminal P2 is selected as a switching output terminal, the second shunt element 211 causes the second output terminal P3 to be electrically isolated from the common input terminal P1.

The DC blocking unit includes a first capacitor C2 and a second capacitor C3. The first capacitor C2 is connected between the first output terminal P2 and the emitter of the first HBT 310 (or Q1); and the second capacitor C3 is connected between the second output terminal P3 and the emitter of the second HBT 311 (or Q2).

A capacitor C1 is connected between the common input terminal P1 and the node ND1, to which the base terminals of the first and second HBTs Q1 and Q2 are connected in common, to serve as a DC blocking capacitor.

An inductor L1 is connected between a power supply voltage terminal VCC and the node ND1, to which the base terminals of the first and second HBTs Q1 and Q2 are connected in common, to prevent an RF signal from being applied to the power. In this case, the power is supplied only to the on-state one of the first and second HBTs Q1 and Q2.

A resistor Rc is connected in series to the gate of each of the NMOS transistors M1 to M4 to transfer the first control signal Vc or the second control signal Vc'.

When the first control signal Vc is applied at a high level, the second control signal Vc' may be applied at a low level.

When the first control signal Vc is logically high, the NMOS transistor M1 serves as a current sink circuit that causes a current of a line L1, which flows from the power supply terminal VCC to the emitter of the HBT Q1, to flow to the ground terminal. When the second control signal Vc' is logically high, the NMOS transistor M2 serves as a current sink circuit that causes a current of a line L2, which flows from the power supply voltage terminal VCC to the emitter of the HBT Q2, to flow to the ground terminal. When the current sink circuit is configured using only the NMOS transistors and the gate resistors, the circuit structure becomes compact.

When the first control signal Vc is logically high and the second control signal Vc' is logically low, the HBT Q1 is turned on to form an RF path between the common input terminal P1 and the first output terminal P2. Also, since the drain-source channel voltage is 0V and the logic low signal is applied as the gate control voltage, the NMOS transistor M3 becomes a high-impedance state. Since the drain-source voltage is 0V and the logic high signal is applied as the gate control voltage, the NMOS transistor M4 becomes a low-impedance state. Accordingly, an RF signal leaking from the common input terminal P1 to the second output terminal P3 is shorted by the NMOS transistor M4. Therefore, the isolation characteristics can be improved even by using the simple circuit. When the first control signal Vc is logically low and the second control signal Vc' is logically high, the opposite operation is performed.

When the HBT Q1 is turned on to perform a switching operation, the parasitic capacitance of the NMOS transistor M1 may affect the RF performance. Ideally, it is necessary to cause the impedance, from the emitter of the HBT Q1 to the NMOS transistor M1, to become infinite so as not to affect the RF performance at all. Thus, as the simplest way, an inductor may be used to block an RF signal leakage. However, using the inductor increases the total size of the SPDT switch severely due to two additional inductors, which is undesirable in terms of size implementation. In the embodiment of FIG. 3, the NMOS transistor is used as a current sink circuit to overcome such size limitations. In the result, when the NMOS transistor is used to reduce the area, the impedance from the HBT Q1 or Q2 (i.e., the switching element) to the current sink becomes very high. Accordingly, the influence of the signal leakage on the RF performance becomes small.

Below, a description is given of the reason for providing the NMOS transistors M3 and M4 at the rear ends of the capacitors C2 and C3 to improve the isolation characteristics. The power supply voltage applied to the power supply voltage terminal VCC may be a constant voltage of about 3V. In this case, the HBT Q1 is turned on to drop a voltage of about 3V by about 1V, so that a voltage of about 2V is applied to the emitter of the HBT Q1. Meanwhile, since the HBT Q2 is in an off state, the emitter terminal of the HBT Q2 ideally has a voltage of about 3V. In this case, the potentials of both the HBTs Q1 and Q2 are formed in the logic-high conditions. This is the reason for providing the NMOS transistors M3 and M4 at the rear ends of the capacitors C2 and C3. If transistors are directly connected in parallel to the emitters of the HBTs Q1 and Q2, not the NMOS transistors M3 and M4 but PMOS transistors must be used in the logic-high potential conditions. In general, a PMOS transistor has a poorer RF performance than an NMOS transistor. Therefore, the use of PMOS transistors need be limited to special cases.

Figure 4:
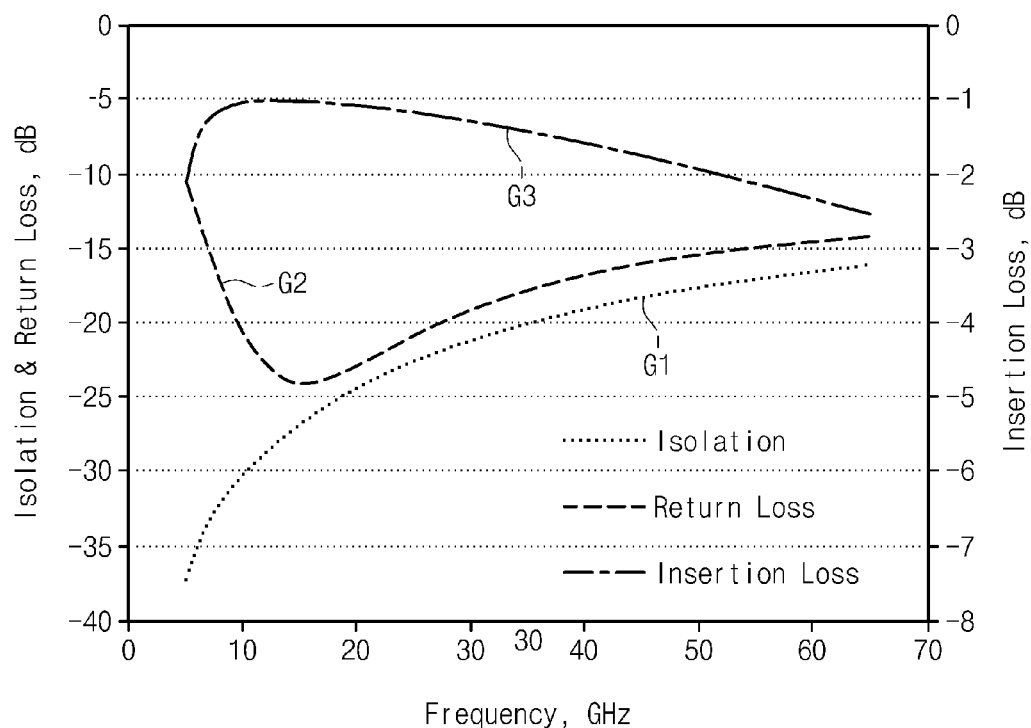
FIG. 4 is a simulation graph illustrating the characteristics of the SPDT switch of FIG. 3.

The use of the SPDT switch of FIG. 3 makes it possible to improve the switching performance in frequency bands higher than the MF band, as illustrated in FIG. 4. That is, when the SPDT switch is fabricated using a process (e.g., a SiGe BiCMOS process) capable of providing both FET-based transistors and BJP-based transistors, the use of the HBT/the NMOS transistor as the switching element/the shunt element makes it possible to provide better RF performances in higher frequency bands than typical switches. Also, the implementation of the current sink circuit for the switching elements Q1 and Q2 by means of the NMOS transistors M1 and M2 makes it possible to provide higher impedance values and small-area SPDT switches.

The simulation graph of FIG. 4, which illustrates the characteristics of the SPDT switch of FIG. 3, shows the RF performance of the SPDT switch according to the embodiment of the present invention. In FIG. 4, the horizontal axis represents the frequency (GHz), the left of the vertical axis represents the isolation and the return loss in dB, and the right of the vertical axis represents the insertion loss in dB.

Referring to FIG. 4, a graph G3 shows that the insertion loss is smaller than about 2.0 dB in a 10-52 GHz band. Each of graphs G1 and G2 shows that the isolation and the return loss are greater than about 15 dB in the 10-52 GHz band. Thus, it can be seen that the SPDT switch according to the embodiment of the present invention has good RF switching performances in relatively wide bands.

The SPDT switches according to the embodiments of the present invention may be applicable to RF components such as switches, high-output amplifiers, oscillators and low-noise amplifiers, which are fabricated using SiGe BiCMOS process technology. The SPDT switches according to the embodiments of the present invention may be more useful in the fields of switching signals of frequencies higher than the X band such as the MF band, because they have good insertion-loss and wide-band characteristics in the RF band.

As described above, the use of the SPDT switch according to the embodiment of the present invention makes it possible to improve the switching performance in the MF band. That is, when the SPDT switch is fabricated using a process (e.g., a SiGe BiCMOS process) capable of providing both FET-based transistors and BJP-based transistors, the use of the HBT/the NMOS transistor as the switching element/the shunt element makes it possible to provide better RF performances in higher frequency bands than typical switches.

Also, the use of the present invention makes it possible to provide a relatively compact circuit structure. That is, the implementation of the current sink circuit for the switching elements Q1 and Q2 by means of the NMOS transistors M1 and M2 makes it possible to provide higher impedance values and small-area SPDT switches.

Also, the use of the SPDT switch according to the embodiment of the present invention makes it possible to implement switches with high-isolation characteristics and improve the signal leakage characteristics. That is, the implementation of the shunt elements M3 and M4 by means of the NMOS transistors makes it possible to provide good switching performances in the MF band or higher frequency bands.

The above-disclosed subject matter is to be considered illustrative and not restrictive, and the appended claims are intended to cover all such modifications, enhancements, and other embodiments, which fall within the true spirit and scope of the present invention. For example, the connection structures of the circuit elements and the circuit structures and the arrangement order of the elements connected thereto may vary according to various embodiments without departing from the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A Single Pole Double Throw (SPDT) switch comprising:
   a serial switching unit including first and second Heterojunction Bipolar Transistors (HBTs) connected in series to a common input terminal;
   a current sink unit sinking a current, flowing from the common input terminal to each of first and second output terminals of the serial switching unit, in response to a control signal;
   a switching isolation unit causing an unselected output terminal of the first and second output terminals to be electrically isolated from the common input terminal when the serial switching unit operates; and
   a Direct Current (DC) blocking unit blocking a DC component between the first HBT and the first output terminal and a DC component between the second HBT and the second output terminal.

2. The SP DT switch of claim 1, wherein the current sink unit includes:
   a first N-type Metal Oxide Semiconductor (NMOS) transistor sinking a current, flowing from the common input terminal to the first output terminal of the serial switching unit, in response to the control signal; and
   a second NMOS transistor sinking a current, flowing from the common input terminal to the second output terminal of the serial switching unit, in response to a complementary control signal complementary to the control signal.

3. The SPDT switch of claim 2, wherein the switching isolation unit includes:
   a first shunt element connected to the first output terminal in parallel to the first NMOS transistor; and
   a second shunt element connected to the second output terminal in parallel to the second NMOS transistor.

4. The SPDT switch of claim 3, wherein the first and second shunt elements each include an NMOS transistor.

5. The SP DT switch of claim 1, wherein the Direct Current (DC) blocking unit includes a capacitor.

6. A Single Pole Double Throw (SPDT) switch comprising:
   a serial switching unit including first and second Heterojunction Bipolar Transistors (HBTs) having bases connected in common to a common input terminal;
   a current sink unit including a first sink element sinking a current, flowing from the common input terminal to a first output terminal of the serial switching unit, in response to a first control signal and a second sink element sinking a current, flowing from the common input terminal to a second output terminal of the serial switching unit, in response to a second control signal;
   a switching isolation unit causing an unselected output terminal of the first and second output terminals to be electrically isolated from the common input terminal when the serial switching unit operates; and
   a Direct Current (DC) blocking unit blocking a DC component between the emitter of the first HBT and the first output terminal and a DC component between the emitter of the second HBT and the second output terminal.

7. The SPDT switch of claim 6, wherein the SPDT switch is configured to switch a Microwave Frequency (MF) band signal.

8. The SP DT switch of claim 7, wherein the first and second sink elements each include an N-type Metal Oxide Semiconductor (NMOS) transistor.

9. The SPDT switch of claim 8, wherein the switching isolation unit includes:
   a first shunt element connected to the first output terminal in parallel to the first sink element; and
   a second shunt element connected to the second output terminal in parallel to the second sink element.

10. The SP DT switch of claim 9, wherein the first and second shunt elements each include an NMOS transistor.

11. The SP DT switch of claim 10, wherein the Direct Current (DC) blocking unit includes a capacitor.

12. A Single Pole Double Throw (SPDT) switch comprising:
   a serial switching unit including a first Hetero-junction Bipolar Transistor (HBT) having a channel connected between a common input terminal and a first output terminal and switching the common input terminal to the first output terminal when a first control signal is applied thereto, and a second HBT having a channel connected between the common input terminal and a second output terminal and switching the common input terminal to the second output terminal when a second control signal is applied thereto;
   a current sink unit including a first Metal Oxide Semiconductor (MOS) transistor having a gate terminal connected to receive the first control signal and a source terminal grounded to sink a current flowing from the common input terminal to the first output terminal of the serial switching unit, and a second MOS transistor having a gate terminal connected to receive the second control signal and a source terminal grounded to sink a current flowing from the common input terminal to the second output terminal of the serial switching unit;
   a switching isolation unit including a first shunt element having a gate terminal connected to receive the second control signal and a drain-source channel connected between the first output terminal and a ground terminal to cause the first output terminal to be electrically isolated from the common input terminal when the second output terminal is selected, and a second shunt element having a gate terminal connected to receive the first control signal and a drain-source channel connected between the second output terminal and the ground terminal to cause the second output terminal to be electrically isolated from the common input terminal when the first output terminal is selected; and
   a Direct Current (DC) blocking unit including a first capacitor connected between the emitter of the first HBT and the first output terminal and a second capacitor connected between the emitter of the second HBT and the second output terminal, to block a DC component.

13. The SP DT switch of claim 12, wherein the first and second MOS transistors each include an N-type MOS (NMOS) Field Effect Transistor (FET).

14. The SP DT switch of claim 13, wherein the first and second shunt elements each include an NMOS transistor.

15. The SPDT switch of claim 14, further comprising a blocking capacitor between the common input terminal and the bases of the first and second HBTs.

16. The SP DT switch of claim 15, further comprising an inductor between a power supply voltage terminal and the bases of the first and second HBTs.

17. The SP DT switch of claim 16, wherein the second control signal is applied at a low level when the first control signal is applied at a high level.

18. The SP DT switch of claim 17, wherein the SP DT switch is fabricated through a SiGe BiCMOS process.

19. The SPDT switch of claim 18, wherein the SPDT switch is configured to switch a Microwave Frequency (MF) band signal.

* * * * *